(12) United States Patent
Werner et al.

(10) Patent No.: US 8,416,424 B2
(45) Date of Patent: Apr. 9, 2013

(54) LASER SELF-MIXING MEASURING DEVICE

(75) Inventors: Klaus Peter Werner, Wijchen (NL); Carsten Heinks, Nordhorn (DE); Marcel Franz Christian Schemmann, Maria Hoop (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 13/001,838

(22) PCT Filed: Jun. 30, 2009

(86) PCT No.: PCT/IB2009/052838
§ 371 (c)(1),
(2), (4) Date: Dec. 29, 2010

(87) PCT Pub. No.: WO2010/004478
PCT Pub. Date: Jan. 14, 2010

(65) Prior Publication Data
US 2011/0116101 A1    May 19, 2011

(30) Foreign Application Priority Data
Jul. 7, 2008   (EP) .................................... 08104662

(51) Int. Cl.
*G01B 11/02* (2006.01)
*G01B 9/02* (2006.01)

(52) U.S. Cl.
USPC ............................ 356/499; 356/521; 356/488

(58) Field of Classification Search .................. 356/521
See application file for complete search history.

(56) References Cited

U.S. PATENT DOCUMENTS

| | | | |
|---|---|---|---|
| 3,419,330 A | | 12/1968 | Schneider |
| 3,743,507 A | * | 7/1973 | Lurie ................................ 430/2 |
| 4,551,018 A | * | 11/1985 | Mannava et al. ............. 356/28.5 |
| 5,122,660 A | * | 6/1992 | Yoshii et al. .............. 250/237 G |
| 5,638,211 A | * | 6/1997 | Shiraishi ....................... 359/559 |
| 5,648,658 A | * | 7/1997 | Holzapfel et al. ......... 250/237 G |
| 6,233,045 B1 | | 5/2001 | Suni et al. |
| 6,246,482 B1 | * | 6/2001 | Kinrot et al. .................. 356/499 |

(Continued)

FOREIGN PATENT DOCUMENTS

| EP | 0947833 A1 | | 10/1999 |
|---|---|---|---|
| GB | 2443662 | * | 9/2006 |
| GB | 2443662 A | | 5/2008 |
| WO | 2005076116 A2 | | 8/2005 |

OTHER PUBLICATIONS

H.Martinsson, J.Bengtsson, M.Ghisoni and A.Larsson Monolithic integration of vertical cavity surface emitting laser and diffractive optical element for advanced beam shaping IEEE photonics Technd. Lett,11,503-505,1999.*

Donati et al: "Self-Mixing Techniques for Sensing Applications"; Proceedings ODIMAP IV, Jun. 2004, pp. 213-214.

Ozdemir et al: "Self-Mixing Laser Speckle Velocimeter for Blood Flow Measurement"; IEEE Transactions on Instrumentation Andm Easurement, Oct. 2000, vol. 49, No. 5, pp. 1029-1035.

(Continued)

*Primary Examiner* — Tarifur Chowdhury
*Assistant Examiner* — Sunghee Y Gray
(74) *Attorney, Agent, or Firm* — David Zivan; Mark Beloborodov

(57) ABSTRACT

A laser self-mixing measuring device is provided, comprising a laser with a laser cavity and a surface arranged along the optical path of the laser beam which redirects incident laser light back into the laser cavity. The surface comprises a periodic structure which diffracts the laser light into partial beams.

15 Claims, 4 Drawing Sheets

U.S. PATENT DOCUMENTS

| | | | |
|---|---|---|---|
| 6,707,027 B2 | 3/2004 | Liess et al. | |
| 7,126,586 B2 | 10/2006 | Jianping et al. | |
| 7,283,214 B2 * | 10/2007 | Xu et al. | 356/5.15 |
| 7,333,185 B2 * | 2/2008 | Wada et al. | 356/28 |
| 2006/0012772 A1 | 1/2006 | Sesko | |
| 2007/0091295 A1 | 4/2007 | Xu et al. | |
| 2009/0147265 A1 * | 6/2009 | Klaver et al. | 356/488 |

OTHER PUBLICATIONS

Hast, J.: "Self-Mixing Interferometry and It's Applications in Noninvasive Pulse Detection"; Academic Dissertation From University of Oulu, 2003, Chapter 2, 7 Pages, Downloaded From http://herkules.oulu.fi/isbn951426973X/ on Sep. 6, 2007.

* cited by examiner

LASER SELF-MIXING MEASURING DEVICE

FIELD OF THE INVENTION

The invention generally relates to the field of optoelectronic devices. More specifically, the invention relates to the measurement of displacement-related parameters such as distance or velocity, using laser self-mixing sensors.

BACKGROUND OF THE INVENTION

Laser self-mixing occurs if an external reflecting surface is arranged within the optical path of a laser so that an external cavity is obtained. Tuning of the external cavity results in a readjustment of the laser equilibrium conditions and thus to detectable changes in the laser output power. These changes, typically in the form of undulations or oscillations, are repetitive as a function of the displacement of the external reflecting surface over a distance of a half laser wavelength. The undulation frequency is proportional to the velocity of the external reflector. A measuring device based on laser self-mixing typically shows a high sensitivity and thus a high accuracy. This can be attributed to the fact that the reflected light re-entering the laser cavity determines the modulation frequency of the laser light and is thus amplified in the laser cavity. In this way, the laser acts as a phase-sensitive detector and amplifier. Accordingly, a high receiver sensitivity is obtained without additional means such as optical filters or complex devices such as interferometers. For example, a laser self-mixing device is known from U.S. Pat. No. 6,707,027 B2. This device makes use of the Doppler phase shift occurring if the reflecting surface has a component of movement along the optical path.

If, however, a laser self-mixing device is used to gauge the velocity or distance of an object having a randomly reflecting surface, the reflected signal strongly depends on the spatially variable reflectivity caused by wavelength-scale structures and/or variations of composition. This may lead to very low reflected signal levels which result in low or even vanishing measuring signals, e.g. on absorptive or black surfaces, but also on very reflective surfaces such as on mirrors, glass or shiny surfaces. This particularly applies to measuring geometries in which the specular beam is not reflected back into the laser cavity.

Another effect is what is called the speckle pattern which is caused by the wavelength-scale structure of the surface. The speckle pattern gives rise to strong random intensity variations which in turn also modulate the self-mixing signal amplitude, frequency and phase. Accordingly, the speckle pattern influences the measurement accuracy of the system with regard to parameter gauges using the undulation or oscillation signal.

OBJECT AND SUMMARY OF THE INVENTION

In view of the above-mentioned problems with known devices, it is an object of the invention to improve the measurement accuracy of a laser self-mixing device. The invention is based on the use of a diffractive element for redirecting a part of a laser beam back into the laser cavity of a laser for measuring displacement-related parameters such as displacement, velocity or rotation of the diffractive element with respect to the laser by means of the laser self-mixing effect.

To this end, a laser self-mixing device is provided, comprising
a laser having a laser cavity for generating a measuring laser beam,
a monitoring device for monitoring the laser intensity or a parameter equivalent thereto,
detection circuitry for detecting periodic changes of the laser intensity monitored by the monitoring device, and
a diffractive element arranged in the optical path of the laser, which redirects a portion of the laser light along the optical path back into the laser cavity. The diffractive element has a periodic structure, which diffracts the incident laser light into partial beams, and is movable with respect to the laser cavity.

The corresponding method of measuring a displacement-related parameter using the laser self-mixing measuring device as described above comprises the steps of:
generating a measuring laser beam within the laser cavity of a laser,
redirecting a portion of the laser light along the optical path back into the laser cavity by a diffractive element having a periodic structure such as, in particular, a grating, which diffracts the incident laser light into partial beams, and moving relative to the laser cavity,
monitoring the laser intensity or a parameter equivalent thereto with a monitoring device, and
detecting periodic changes of the laser intensity monitored by the monitoring device, using detection circuitry and calculating the displacement-related parameter from the detected periodic changes of the laser intensity.

The purpose of the diffractive element instead of a diffuse reflecting surface is to evenly reflect the incident laser light back into the laser cavity, thereby eliminating or at least considerably suppressing speckle-related phenomena.

The displacement-related parameter may be the displacement itself, the velocity, i.e. the displacement per unit of time, an angle of rotation corresponding to the displacement of a surface, e.g. the circumferential surface of a rotating member or the angular speed, corresponding to the displacement of the circumferential surface of a rotating member per unit of time. The diffractive structures preferably cover the entire area which may be eventually impinged upon by the laser beam or beams in the application.

In order to measure parameters related to a displacement using the self-mixing effect in combination with a phase shift induced by the movement of the diffractive element with respect to the laser, it is advantageous if the diffractive element is movable along a direction having a component along the direction of the incident laser beam. In this way, movement of the diffractive element causes a tuning of the external cavity, resulting in undulations of the laser intensity due to self-mixing with the diffracted partial beam.

In principle, the invention works with all types of lasers in which the self-mixing effect can occur. However, a laser diode as laser is particularly preferred because laser diodes are small and cost-saving devices. The laser diode may be both an edge-emitting and a vertical cavity surface emitting laser (VCSEL).

According to a preferred refinement of the invention, a photodiode integrated with the laser is employed as a monitoring device. Alternatively, an external photodiode may be employed. An external photodiode may be advantageous to achieve very high signal levels. For this purpose, the photodiode may be placed in the optical path of one of the partial beams emanating from the diffractive element which is not re-directed back into the laser cavity. This partial beam may also be the specular beam.

It is further advantageous to use a structured film as a diffractive element. This film or foil can be attached to the movable member, a displacement-related parameter of which is to be determined. In particular, given the fact that the structural and/or mechanical requirements of the diffractive element are low, cheap structured plastic films can be used. Moreover, a holographic metal foil may be employed as a diffractive element.

An additional focusing element is preferably provided to converge the beam towards the diffractive element. In particular, the focusing element may focus the laser beam onto the periodic structure of the diffractive element.

Furthermore, the laser self-mixing measuring device may comprise a deflecting optical element which deflects the laser beam so that it is incident on the surface of the diffractive element at an oblique angle. This configuration allows arrangement of the laser with respect to the surface to be measured in a simple configuration in which the laser beam is emitted vertically to the moving surface, and the surface moves along a lateral direction thereof.

This embodiment is particularly advantageous for a compact design in combination with a VCSEL as laser. Employing a VCSEL and a deflecting element allows the laser to be directly mounted on a circuit board retained parallel to the moving diffractive element. Furthermore, the focusing element and the deflecting element may be advantageously combined by using a lens arranged off-axis with respect to the laser beam.

To optimize the diffraction backwards along the optical path, the periodic structure of the diffractive element may advantageously comprise a blazed grating.

Furthermore, to eliminate speckle effects based on specular reflection, the surface of the diffractive element may advantageously be arranged obliquely to the direction of the incident laser beam.

It is also advantageous to design and position the diffractive element with respect to the laser in such a way that a partial beam having a diffraction order other than zero order is redirected back into the laser cavity. To achieve this, the angle of incidence α may advantageously satisfy the condition $d \cdot \sin(\alpha) = m \cdot \lambda/2$. In this equation, d denotes the grating pitch (i.e. the distance between the grating lines or other diffractive structures). Furthermore, λ denotes the laser wavelength and m is an integer. In particular, m may be negative, as the light is diffracted backwards along the optical path.

However, it is not necessary to match this condition perfectly. Rather, the advantages of a strong and constant self-mixing signal are obtained as long as the deviation of the partial beam diffracted backwards to the incident laser beam is small enough so that the diffracted partial beam at least partially re-enters the laser cavity. In this regard, a focusing element is advantageous for compensating deviations of the directions of the incident beam and the partial beam diffracted backwards to the laser cavity. Specifically, a part of the partial beam can still re-enter the laser cavity as long as the pencil beams of the incident laser beam and the diffracted partial beam overlap. To redirect a diffracted partial beam back into the laser cavity, it is also advantageous to position the diffractive element in such a way that its diffractive structures extend vertically to the plane of incidence. Again, however, it is not necessary to match this condition exactly so that the diffractive structures may be slightly tilted to the perpendicular of the plane of incidence because a partial beam will be redirected into the laser cavity as long as this beam overlaps with the incident beam.

The invention may be used for measuring distance and movements (both speed and direction) of objects with a very high accuracy. The diffractive element may have a translational and/or a rotational movement. Generally, the invention provides a low-cost alternative for devices based on interferometry or making use of expensive glass standards or the like.

The invention can measure infinite distances, e.g. the rotation of axes or closed surfaces such as conveyor belts. It is not bound to a known or calibrated mechanical reference and can detect movement of any reasonably smooth surface along with the diffractive property.

Depending on the application, displacement-related parameters associated with a movement of varying direction within a plane may be sensed. For this purpose, a two-dimensional grating as a diffractive element and two lasers may be employed. A two-dimensional grating is referred to as a grating having diffractive structures effective in two non-coincident directions along the surface of the grating. For example, the grating may be a grid of intersecting line-shaped structures, i.e. a combination of two one-dimensional gratings, or line gratings, respectively. Moreover, a point grid may be employed. To detect the movement in an arbitrary direction along the grating, the lasers are positioned in such a way that the planes of incidence defined by the optical paths of the lasers and the two-dimensional grating enclose an angle. It is further advantageous to design and position the grating in such a way that diffracted beams are redirected into the laser cavities for each laser.

Applications in rotational, linear, 2D and 3D-metrology tools and machines such as angle, displacement and speed encoders are envisaged. The invention can likewise be used in high-precision machining tools, both for linear and rotational movement.

Furthermore, a highly sensitive detection of movement can be realized and applied in vibration measurement systems and contact or position detection switches.

The diffractive element such as in particular a grating does not only provide a well-defined uniform intensity of the backscattered laser beam but also provides the possibility of encoding information by suitable modulation of the diffractive pattern. In this way, the backscattered laser beam is modulated in conformity with the pattern so that the encoded information can be decoded from the self-mixing signal.

A very useful example in this regard is encoding position data, particularly absolute position data. One possibility of encoding the information is to vary the blaze angle of a blazed grating. Generally, the modulation may include a phase, a frequency, and/or an amplitude modulation. For example, a bar-code like representation may be used.

According to one aspect of the invention, a laser interferometric measuring device for measuring displacement-related parameters is thus provided, the device comprising:
- a laser having a laser cavity for generating a measuring laser beam,
- a diffractive element arranged in the optical path of the laser, which diffracts a portion of the laser light owing to a periodic structure, which diffracts the incident laser light into partial beams, and being movable with respect to the laser cavity,
- a monitoring device for monitoring the laser intensity superpositioned by a diffracted partial beam diffracted at the diffractive element, and
- detection circuitry for detecting changes of the laser intensity monitored by the monitoring device due to interference of the laser beam with the diffracted partial beam.

This embodiment also encompasses interferometric sensors for sensing displacement-related parameters other than self-mixing sensors because the principle of using a diffractive surface as a reflector for measuring displacement-related parameters such as distance or velocity, in which the diffractive pattern is modulated to convey additional information, is independent of a detection of the oscillations by self-mixing. For example, an external cavity sensor may be used instead of a self-mixing sensor. Specifically, the superposition of the primary laser beam or a part thereof and a beam reflected from the moving surface are superpositioned externally to the laser cavity in an external cavity sensor.

BRIEF DESCRIPTION OF THE DRAWINGS

The foregoing and other objects, aspects and advantages of the present invention will be better understood from the following detailed description with reference to the drawings, in which.

DESCRIPTION OF EMBODIMENTS

Figure 1:
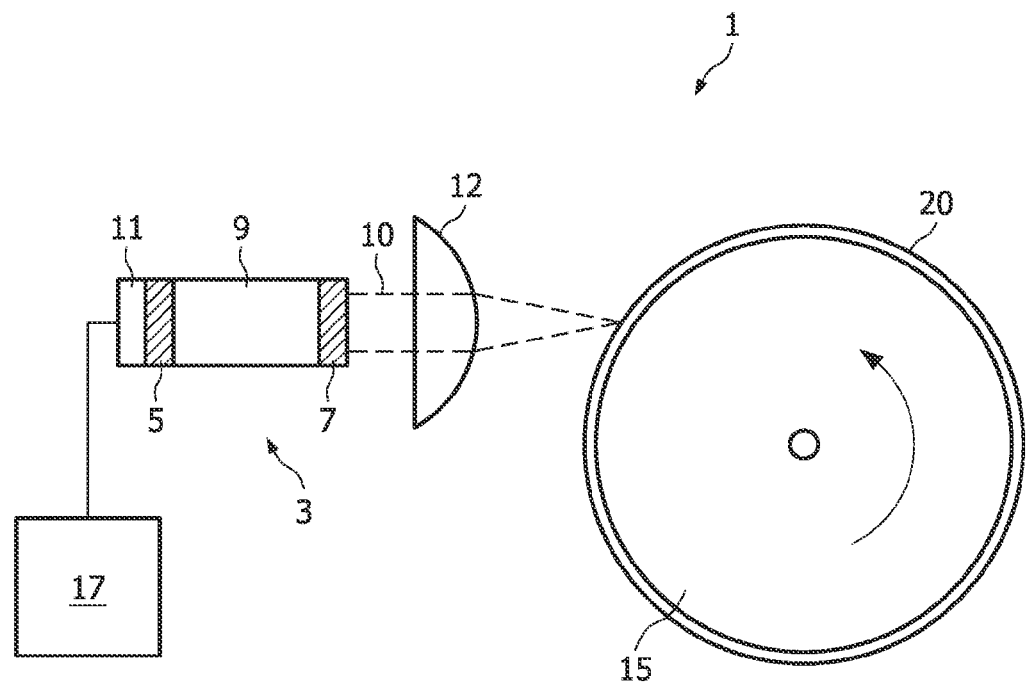
FIG. 1 shows schematically a laser self-mixing measuring device.

FIG. 1 shows, by way of example, a setup of a laser self-mixing measuring device 1. The laser self-mixing measuring device 1 comprises
 a laser 3 having a laser cavity 9 for generating a measuring laser beam 10,
 a monitoring device for monitoring the laser intensity or a parameter equivalent thereto,
 detection circuitry 17 for detecting periodic changes of the laser intensity monitored by the monitoring device, and
 a diffractive element having a periodic structure, which diffracts the incident laser light into partial beams, and being arranged in the optical path of the laser. The diffractive element redirects a portion of the laser light along the optical path back into the laser cavity and is movable with respect to the laser cavity 9.

The cavity 9 of the laser 3 is confined between two Bragg reflectors 5, 7. A monitoring photodiode 11 is arranged behind the rear-side Bragg reflector 5. A small portion of the laser light passes through the Bragg reflector 5 and can thus be monitored by the photodiode 11. The laser 3 is preferably a diode laser.

The device as shown is a setup for measuring the rotational velocity or angle of rotation of a rotating member 15. For this purpose, a diffractive element 20 in the form of a structured film is provided on the lateral surface of the rotating member. As the rotating element 15 rotates, its lateral surface and the structured film thereon move with respect to the laser cavity 9. Specifically, as can be seen from FIG. 1, the laser 3 and the rotating member 15 are arranged relative to each other so that the surface of the diffractive element 20 is arranged obliquely to the direction of the incident laser beam 10 at the point of incidence of the laser beam 10. In this way, the diffractive element moves in a direction having a component along the direction of the incident laser beam upon rotation of the rotating member. Specifically, depending on the sense of rotation, the component of movement is either parallel or antiparallel to the laser beam 10.

Furthermore, a part of the laser light is redirected along the optical path after being reflected or scattered at the diffractive element 20 and enters the laser cavity 9 again. Due to the component of movement of the diffractive element 20 parallel or antiparallel to the incident laser beam, the phase of the redirected part of the laser beam 10 is shifted. This shift causes a time-varying phase shift with respect to the generated laser beam. As the redirected laser light and the generated laser light interfere within the laser cavity 9, the varying phase shift causes oscillations in laser intensity.

Generally, the number of oscillations per unit of time directly corresponds to the amount of phase shift and thus also to the value of the velocity component along the direction of the incident laser beam 10. A parameter corresponding to the displacement of a surface of the rotating member, e.g. the circumferential surface, and thus to the angle of rotation can be obtained by counting the number of oscillations.

The laser intensity is monitored by the photodiode 11 and the monitoring signal is fed to the detection circuitry 17, wherein the oscillations of the laser intensity are detected and analyzed.

To further improve the sensitivity of the setup, a lens 12 is arranged in the optical path. The lens 12 focuses the laser beam 10 onto the action plane, i.e. the structure of the diffractive element 20.

Figure 2:
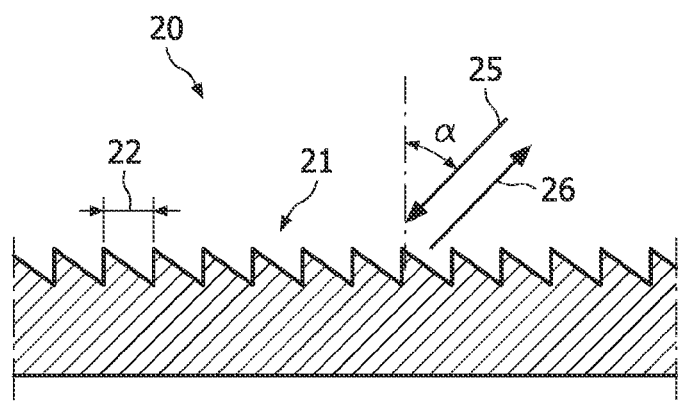
FIG. 2 shows a diffractive element.

FIG. 2 shows a part of a diffractive element 20 in the form of a structured film as may be advantageously employed in the arrangement shown in FIG. 1.

According to this embodiment, the diffractive element 20 may be a plastic film with an embossed grating 21. Due to the small pitch 22 of the grating 21, the incident laser beam is split into partial beams corresponding to different orders of diffraction. The pitch 22 of the grating lines and the angle of incidence $\alpha$ with respect to the direction 25 of the incident laser beam is chosen to be such that a partial beam having a diffraction order other than zero order is redirected back into the laser cavity along direction 26. For example, the beam diffracted back along direction 26 may be the minus $1^{st}$ order partial beam. To achieve coincidence of the incident beam and the redirected partial beam, the condition $d \cdot \sin(\alpha) = m \cdot \lambda / 2$ should be satisfied, wherein d is the grating pitch 22. However, a certain deviation is tolerable as long as at least a part of the redirected diffracted beam enters the laser cavity.

It is advantageous to use a blazed grating as shown in FIG. 2. Due to the blazed reflection surfaces of the grating lines, the reflected light in the direction of the incident beam can be maximized. Hence, also the maximum working distance of the measuring system can be increased.

Figure 3:
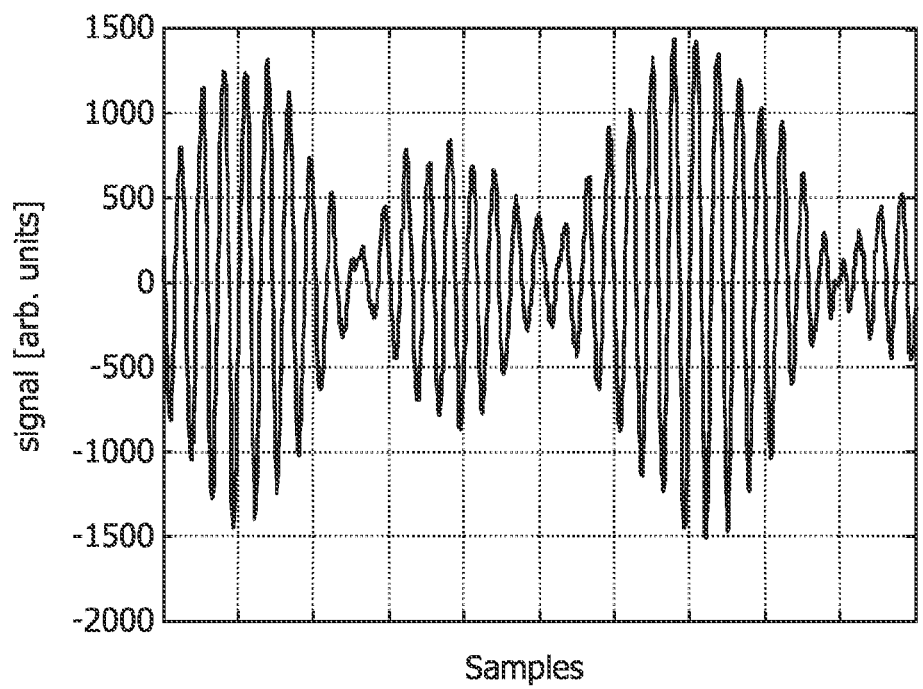
FIG. 3 shows the self-mixing signal of a diffuse reflecting surface.

FIG. 3 shows the self-mixing signal obtained from a moving, conventional diffuse reflecting surface as a function of the sample index. As the samples are recorded in regular time intervals, the abscissa also represents the time axis. The self-mixing signal is the variation of the laser power.

As can be seen from FIG. 3, the laser signal oscillates around a mean value which therefore represents the value "0" on the ordinate. The periodic oscillations arise from the phase shift caused by the component of movement of the surface in a direction parallel or antiparallel to the incident laser beam. Furthermore, the amplitude of the self-mixing signal shows an intense random variation on a longer time scale. This variation is attributed to the speckle pattern and is so intense that the self-mixing signal nearly vanishes at certain points. It is obvious that, particularly at these points, the measurement accuracy degrades.

Figure 4:
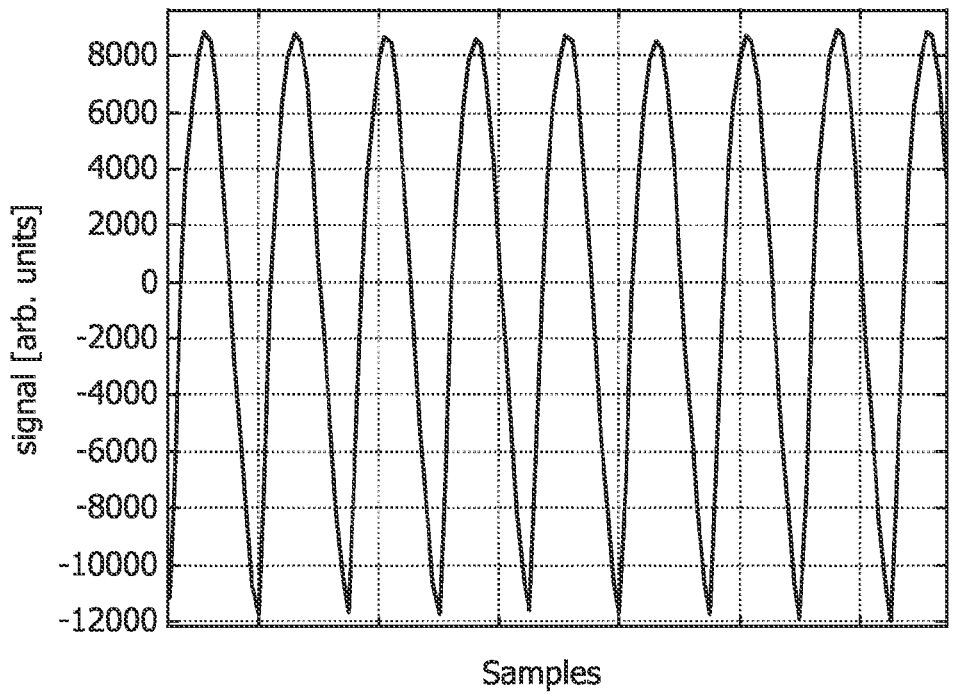
FIG. 4 shows the self-mixing signal of a diffraction grating.

For comparison, FIG. 4 shows a diagram of the self-mixing signal obtained by using a moving diffractive element instead of a moving diffuse reflecting surface.

As is clear from FIG. 4, the diffractive structure completely or at least nearly completely eliminates speckle pattern-related intensity variations.

The diffractive structure effects an evenly reflection of the incident laser light back into the laser cavity, thereby eliminating the speckle effect. Even if an additional diffuse reflection appears, speckle effects still remain strongly suppressed as long as the most redirected light originates from diffraction at the regular structure of the diffractive element. As can also be estimated from FIG. 4, the variation of the oscillation amplitude is generally less than ¼ of the oscillation amplitude.

As can also be seen from FIG. 4, the light intensity oscillations are not sinusoidal. Rather, the shape of the oscillations is slightly asymmetric. This asymmetry is indicative of the direction of movement. Due to the strong self-mixing signal, a high signal quality is achieved, which also substantially facilitates an evaluation of the shape of the oscillations. Accordingly, it is possible to determine the direction of movement with improved reliability.

Figure 5:
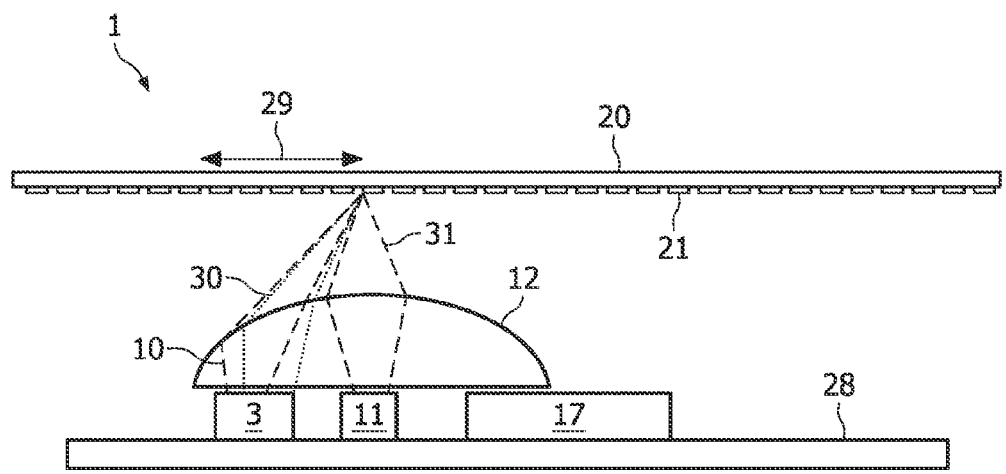
FIG. 5 shows schematically a further embodiment of a laser self-mixing measuring device.

FIG. 5 shows a further embodiment of a laser self-mixing measuring device 1. The laser self-mixing measuring device 1 is designed to determine a displacement-related parameter for a displacement of the diffractive element 20 along direction 29. The displacement-related parameter may be the displacement itself or the velocity, i.e. the displacement per unit of time. In this embodiment, the laser 3 is mounted on a circuit board 28 together with further electronic components such as the detection circuitry 17. The circuit board 28 is retained parallel to the surface of the diffractive element 20 and the grating 21, respectively. The laser 3 of this embodiment may advantageously be a VCSEL so that the VCSEL chip can be mounted directly on the circuit board 28 with the laser beam 10 emitted vertically to the circuit board 28. Similarly as in the embodiment shown in FIG. 1, a lens 12 as a converging element is placed in front of the laser 3. The lens 12 is positioned off-axis with respect to the emitted laser beam 10 so that the laser beam 10 is additionally deflected and impinges on the grating at an oblique angle.

The grating 21 splits the laser beam into several diffracted beams. One of the diffracted beams 31 having a diffraction order other than zero order is redirected back into the laser cavity. As shown in FIG. 5, the emitted laser beam 10 and the redirected diffracted partial beam at least partially overlap.

Similarly as in the embodiment shown in FIG. 1, the light intensity may be detected with an internal monitoring photodiode of laser 3. It is also possible to use an external photodiode 11 as shown in FIG. 5. This photodiode 11 may advantageously be positioned on the circuit board so that it receives the light of another diffracted partial beam 31.

Figure 6:
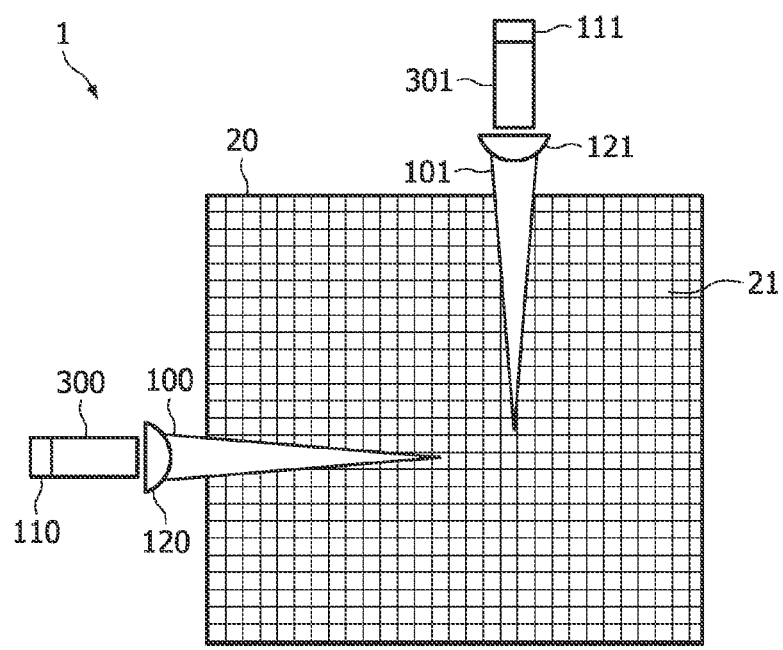
FIG. 6 is a top view of an embodiment with two lasers.

FIG. 6 is a top view of an embodiment of a laser self-mixing device 1 set up for detection of displacement in an arbitrary lateral direction along the diffractive element 20. Two lasers 300 and 301 are provided for this purpose. The diffractive element 20 comprises a two-dimensional, meshed grating 21. The laser beams 100 and 101 of the lasers 300, 301 are focused by lenses 120, 121 and are incident on the grating 21 in two different lateral directions. Accordingly, the planes of incidence of the laser beams 100, 101 defined by the optical paths of the lasers 300, 301 and the two-dimensional grating 21 enclose an angle. Specifically, the lasers 300, 301 in the embodiment shown by way of example in FIG. 6 are positioned in such a way that the planes of incidence enclose a right angle so that perpendicular components of displacement or movement of the grating 21 are detected by the lasers 300, 301. As the grating is structured two-dimensionally, it is effective for both lasers so that for each laser 300, 301, the incident beam is split into partial beams which are redirected back along the respective optical path. For this purpose, the two-dimensional grating is further aligned in such a way that, for both lasers 300, 301, grating lines extend vertically to the respective plane of incidence. Each laser 300, 301 is furnished with a monitoring photodiode 110 and 111, respectively, for monitoring the intensity oscillations of the lasers 300, 301.

Figure 7:
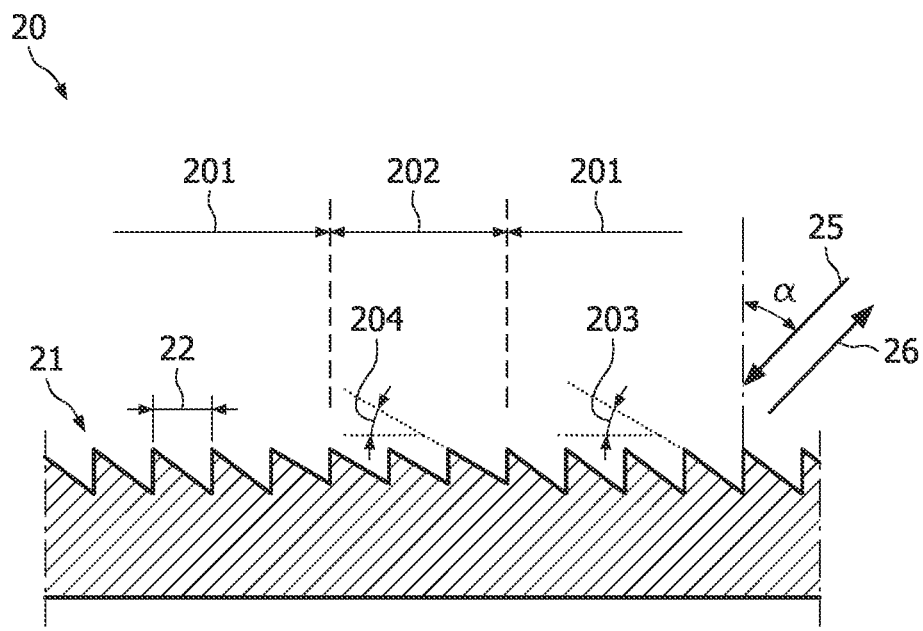
FIG. 7 shows a variant of a diffractive element as shown in FIG. 2, in which data are encoded as a modulation of the blaze angle of the grating.

FIG. 7 shows a variant of the embodiment shown in FIG. 2. According to this variant, the grating 21 is divided into regions 201, 202 alternating along the direction of the surface scanned by the incident beam 10 upon movement of the diffractive element.

As can be seen from FIG. 7, the blaze angle 204 in regions 202 is slightly smaller than the blaze angle 201 of the grating lines within regions 201. This also alters the intensity of the partial beam diffracted back into the laser cavity. Accordingly, the laser self-mixing signal is amplitude-modulated and the data may be easily retrieved by evaluating the amplitude of the self-mixing oscillations. By varying the width of regions 201 and/or 202, data such as absolute position data may thus be easily encoded, e.g. in a bar code scheme. Another possibility is to assign a binary sequence to a sequence of regions 201, 202. Of course, there are further possibilities of encoding data by varying the blaze angle.

Figure 8:
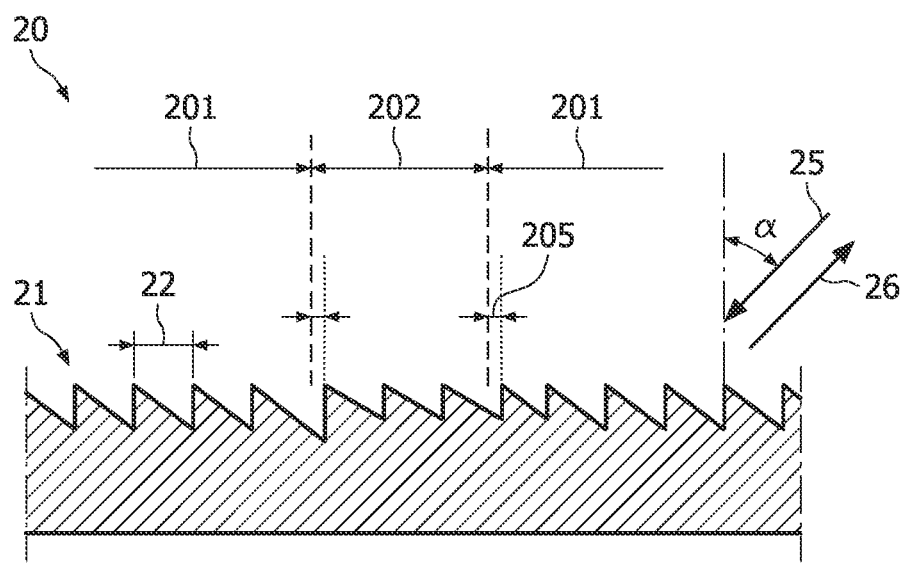
FIG. 8 shows a further variant of a diffractive element as shown in FIG. 2, in which data are encoded as a phase modulation of the grating.

FIG. 8 shows a further variant of a diffractive element 20 as shown in FIG. 2. Similarly to the variant shown in FIG. 7, data are represented by alternating regions 201 and 202. However, in the variant shown in FIG. 8, the regions 201, 202 are distinguished by a phase modulation. For this purpose, the grating lines within regions 202 are slightly shifted by a small distance 205 with respect to the positions obtained by periodically perpetuating the grating lines within regions 202.

Although preferred embodiments of the present invention have been illustrated in the accompanying drawings and described in the foregoing description, it will be understood that the invention is not limited to the embodiments disclosed and that numerous modifications can be conceived by those skilled in the art without departing from the scope of the invention as set out in the following claims.

The invention claimed is:

1. A laser self-mixing measuring device comprising:
   a laser having a laser cavity for generating measuring laser light;
   a monitoring device for monitoring laser intensity,
   detection circuitry for detecting periodic changes of the laser intensity monitored by said monitoring device; and
   a diffractive element arranged in an optical path of the laser, which redirects a portion of the laser light along the optical path back into the laser cavity, said diffractive element including a blazed grating comprising regions of different blazing angles, which diffracts the laser light into partial beams, and being movable with respect to the laser cavity, wherein the monitoring device is configured to monitor the laser intensity on the optical path in the laser cavity on which said portion of the laser light is redirected by the diffractive element and wherein the detection circuitry is configured to detect the periodic changes, which result from movement of the diffractive element.

2. The laser self-mixing measuring device according to claim 1, comprising a focusing element which focuses the laser light onto the diffractive element.

3. The laser self-mixing measuring device according to claim 1, wherein a surface of the diffractive element is arranged obliquely to a direction of the laser light that is incident to the surface of the diffractive element.

4. The laser self-mixing measuring device according to claim 1, wherein said diffractive element includes diffractive structures extending vertically to a plane of incidence.

5. The laser self-mixing measuring device according to claim 1, comprising a deflecting optical element which deflects the laser light in such a way that the laser light is incident on a surface of said diffractive element at an oblique angle.

6. The laser self-mixing measuring device according to claim 1, in which the diffractive element is positioned in such a way that a partial beam having a diffraction order other than zero order is redirected back into the laser cavity.

7. The laser self-mixing measuring device according to claim 1, comprising a structured film as the diffractive element, said structured film being attached to a movable member.

8. The laser self-mixing measuring device according to claim 1, comprising a laser diode as the laser and a photodiode integrated with the laser as a monitoring device.

9. The laser self-mixing measuring device according to claim 1, wherein the diffractive element is movable in a direction having a component along a direction of the laser light that is incident to the diffractive element.

10. The laser self-mixing measuring device according to claim 1, wherein the diffractive element comprises a two-dimensional grating, the device further comprising an additional laser with an additional optical path, wherein planes of incidence are defined by the optical paths of the lasers and the two-dimensional grating enclosing an angle.

11. The laser self-mixing measuring device according to claim 1, wherein the regions of different blazing angles encode data.

12. The laser self-mixing measuring device according to claim 11, wherein the data is position data.

13. A method of measuring a displacement-related parameter using a laser self-mixing measuring device, the method comprising the steps of:
generating measuring laser light within a laser cavity of a laser;
redirecting a portion of the laser light along an optical path on which said laser light traverses back into the laser cavity by a diffractive element including a blazed grating comprising regions of different blazing angles, which diffracts the laser light into partial beams, and moving relative to the laser cavity;
monitoring a laser intensity on the optical path in the laser cavity on which said portion of the laser light is redirected by the diffractive element with a monitoring device; and
detecting periodic changes of the laser intensity monitored by said monitoring device using detection circuitry and calculating said displacement-related parameter from the detected periodic changes of the laser intensity.

14. The method according to claim 13, wherein the regions of different blazing angles encode data.

15. The method according to claim 14, wherein the data is position data.

* * * * *